US005743956A

United States Patent [19]
Habuka et al.

[11] Patent Number: 5,743,956
[45] Date of Patent: Apr. 28, 1998

[54] METHOD OF PRODUCING SINGLE CRYSTAL THIN FILM

[75] Inventors: Hitoshi Habuka, Maebashi; Masanori Mayuzumi, Annaka, both of Japan

[73] Assignee: Shin-Etsu Handotai, Co., Ltd., Tokyo, Japan

[21] Appl. No.: 665,290

[22] Filed: Jun. 17, 1996

[30] Foreign Application Priority Data

Jun. 20, 1995 [JP] Japan ................................. 7-153105

[51] Int. Cl.⁶ ................................................. C30B 25/10
[52] U.S. Cl. ........................... 117/89; 117/101; 117/102
[58] Field of Search ........................ 117/108, 89, 105, 117/102, 204, 3, 101

[56] References Cited

U.S. PATENT DOCUMENTS

| | | | |
|---|---|---|---|
| 3,042,494 | 7/1962 | Gutsche | 117/102 |
| 3,293,074 | 12/1966 | Nickl | 117/102 |
| 3,419,424 | 12/1968 | Steggewentz | 117/102 |
| 4,147,571 | 4/1979 | Stringfellow | 117/89 |
| 4,413,022 | 11/1983 | Suntola | 117/89 |
| 4,632,711 | 12/1986 | Fujita | 117/102 |
| 5,443,033 | 8/1995 | Nishizawu | 117/89 |

Primary Examiner—Robert Kunemund
Assistant Examiner—Evelyn Defilló
Attorney, Agent, or Firm—Oliff & Berridge, PLC

[57] ABSTRACT

A method of producing a high-quality single crystal thin film in which a temperature of a semiconductor single crystal substrate is raised or lowered in a short time with no occurrence of slippage in the substrate. In a cold-wall type reaction vessel, a substrate is placed on a holder which has no heating capability in the reaction vessel and a thin film is grown on the substrate, while a reaction gas is fed to flow in one direction through the reaction vessel, and at the same time, a temperature profile on the substrate along the flow direction of the reaction gas is adjusted to be uniform by a spatially controlled heating energy distribution and/or with the help of an auxiliary heating region provided at an upstream part of the substrate.

20 Claims, 5 Drawing Sheets

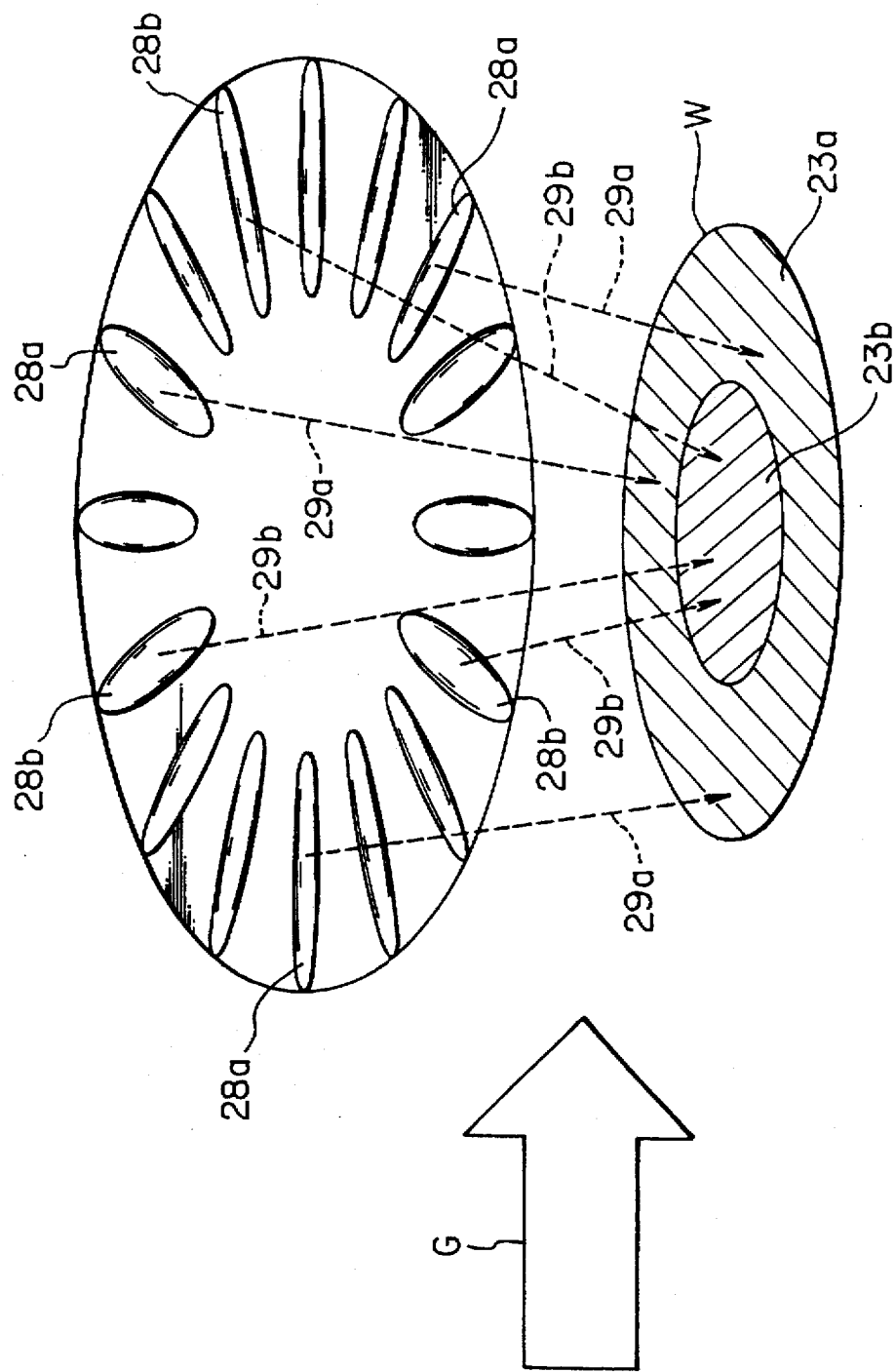

METHOD OF PRODUCING SINGLE CRYSTAL THIN FILM

BACKGROUND OF THE INVENTION

1. Field of the Invention

The present invention relates to a method of producing a single crystal thin film by means of vapor phase growth on a semiconductor single crystal substrate(s).

2. Related Art

A single crystal thin film of a few μm thick is formed by a vapor phase growth method on a semiconductor single crystal substrate in a semiconductor device fabrication. In the step, a horizontal vapor phase growth apparatus 20 of a cold wall type, for example, as shown in FIG. 4, is used. The horizontal vapor phase growth apparatus 20 has a reaction vessel 22 made of transparent quartz glass which is horizontally held. The reaction vessel 22 has a inlet port 24 and an exhaust port 26 for a reaction gas. In the environs surrounding the reaction vessel 22, heating means 28a, 28b for heating a semiconductor single crystal substrate(s) W and a cooling means 30 for cooling the outer wall of the reaction vessel 22 are equipped. On the other hand, a susceptor 32 is placed inside the reaction vessel 22. The susceptor 32 is generally made of carbon or graphite coated with a thin silicon carbide, and supported on a rotary shaft 34 in such a way that it is rotatable in a plane parallel to a stream of the reaction gas G.

When a vapor phase growth is conducted in the horizontal vapor phase growth apparatus 20, a semiconductor single crystal substrate(s) W is placed in a recess formed on the susceptor 32 which is inserted in the reaction vessel 22. The susceptor 32 and the substrate(s) W are both heated up to temperatures in a range of 1000° C. to 1200° C. by radiation beams 29a, 29b emitted from the heating means 28a, 28b such as radiation heating lamps and the like, through the wall of the reaction vessel 22 made of transparent quartz glass. A mixture gas of H2, a raw material gas and a dopant is fed from a gas inlet 24 into the reaction vessel 22 as a reaction gas G and it flows roughly-horizontal in one direction in the space of the reaction vessel 22, wherein the raw material gas is, for example, trichlorosilane or $SiHCl_3$ an the like and the dopant is, for example, diborane ($B_2H_6$) or the like. In such a way, a single crystal thin film(s) is grown on the semiconductor single crystal substrate(s) W.

In a vapor phase growth, since a crystal defect so called slippage occurs in the bulk of a semiconductor single crystal substrate W when a thermal stress is generated due to a temperature difference produced therein, the heating means 28a, 28b which comprise respective two subgroups, one facing to a front side of the substrate W and the other facing to the back side of the susceptor 32 are assembled for heating up the substrate W and susceptor 32 at the same time by radiation from both sides. That is, the substrate W and susceptor 32 are heated up at the same time by radiation from both side of the assembly of them. Subgroups comprising the heating means 28a, 28b heat up the backside surface of the substrate W, while another subgroups of the heating means 28a, 28b heat up the front main surface of the substrate W. In the condition, the temperature difference between the front main surface and backside surface can be minimized in order to prevent a thermal stress.

Even though heating from both the front main surface of a semiconductor single crystal substrate W and the backside surface of a susceptor 32 supporting the substrate W thereon, since the substrate W has a much smaller heat capacity compared with that of the susceptor 32, a temperature of the substrate W rises faster than one of the susceptor 32 thereby increase a temperature difference therebetween during a temperature raising process. Such a temperature difference causes a relatively lower temperature at the backside surface of the substrate W compared with the front main surface of the substrate W and thereby brings about slippage in the bulk of the substrate W.

Then it is necessary that a temperature is raised slowly enough in order to minimize the temperature difference between the substrate W and the susceptor 32. However, if a temperature raising rate is smaller, that is, a temperature of the substrate W is raised more slowly, then a time required for a temperature raising process is longer to that extent and at the same time the productivity is lowered correspondingly.

SUMMARY OF THE INVENTION

The present invention was made in light of the above-mentioned problems. It is an object of the present invention to provide a method of producing a single crystal thin film with a high quality, wherein a temperature of a semiconductor single crystal substrate(s) is raised or lowered in a short time, while occurrence of slippage is suppressed.

The present invention is directed to a method of producing a single crystal thin film in a reaction vessel of a cold wall type with a holder which has no capability of heating, said method comprising the steps of: placing a semiconductor single crystal substrate(s) on the holder: feeding a reaction gas to flow in one direction in the vessel; adjusting a temperature profile of the substrate(s) to be uniform along the flow direction of the reaction gas and growing the single crystal film on the substrate(s).

In an aspect of the method above of the present invention, the temperature profile of the semiconductor single crystal substrate is made uniform by heating more intensively at the upstream side than at the downstream side of the substrate(s) relative to the center of the substrate(s). For example, it is preferred that the heating is spatially adjusted in such a manner that a temperature of the upstream side is higher than one of the downstream side by a difference in radiation energy equivalent to 5° C. to 10° C. in temperature change of the substrate.

In another aspect of the method above of the present invention, an auxiliary heating region of a reaction gas is provided in an upstream part relative to the semiconductor single crystal substrate in order to realized a uniform temperature profile of the substrate. It is preferred that the auxiliary heating region is made of, for example, carbon and the region functions as a heater is coated by any material of silicon, silicon carbide, quartz and ceramics.

In a further aspect of the method above of the present invention, the susceptor with no heating capability is made of quartz or silicon carbide and the semiconductor single crystal substrate(s) is supported on the holder with pointed ends of three or more small projections provided on the holder so that the ends contact to the backside surface of the substrate(s) or with a ring-like body lying between the substrate(s) and the holder.

The inventors conducted experiments on vapor phase growth of a single crystal thin film in the course leading to the present invention. FIG. 3 is a schematic, sectional view illustrating a horizontal vapor phase growth apparatus used in the vapor phase growth experiments of a single crystal thin film. In FIG. 3, the reference numerals indicating the same or similar parts are same as those in FIG. 4.

The horizontal vapor phase growth apparatus 10 as shown in FIG. 3 was used in the vapor phase growth experiments.

A semiconductor single crystal substrate W was supported on a holder 4 made of quartz or silicon carbide which has no capability of heating with pointed ends of three or more small projections provided thereon, or a ring-like body lying therebetween. The substrate W was directly heated by radiation 9 from a heating means 8 which located in the neighborhoods of both sides of the front main surface and backside surface. The substrate W was able to be satisfactorily heated up to a vapor growth temperature of 1000° C. to 1200° C. without using a susceptor.

In the case, since the heating was performed without using a susceptor, raising of a temperature of the semiconductor single crystal substrate W, whose heat capacity was small, was effected in a short time and thereby a processing time was shortened. For example, a required time for raising or lowering the temperature was only about one fifth of that in a case with a susceptor 32.

However, when a reaction gas G of about a room temperature is introduced through a inlet pot 24 of the reaction gas G into a reaction vessel 22 because the reaction gas G is not heated up almost by any degree, while flowing from an inlet port 24 to a semiconductor single crystal substrate W, a part of the front main surface of the substrate W which has been touched with the reaction gas of a low temperature is rapidly cooled down. And a single crystal thin film grown in vapor phase suffers from occurrence of slippage, since the substrate W is not placed on a susceptor with a heating capability.

Temperatures were measured about a semiconductor single crystal substrate W in which a thermocouple was embedded. Temperatures of the upstream side relative to the center of the substrate W was found lower than those of the downstream side by 5° C. to 10° C.

From the above observation and consideration based thereon, the inventors reached to a conclusion which led the completion of the present invention that it was indispensable to realize a uniform temperature profile throughout a semiconductor single crystal substrate W along the flow direction of a reaction gas G in order to produce a single crystal thin film with a high quality in which slippage occurrence was prevented, when the growth was conducted without using a susceptor. The inventors found that the following two methods are preferably applicable for adjusting a temperature profile of a semiconductor single crystal substrate to be uniform.

A first method is to heat the upstream side relative to the center of a semiconductor single crystal substrate 32 more intensively than the downstream side, for example, by a difference in terms of receiving energy equivalent to 5° C. to 10° C. in temperature change of the substrate 32 to make up for a decrease in temperature of the upstream side by a cooling effect of the reaction gas G.

A second method is to provide an auxiliary heating region of the reaction gas in an upstream part relative to a semiconductor single crystal substrate 32 and therewith a cold reaction gas is heated up enough not to cool the front main surface of the substrate 32 prior to the contact to the front main surface.

BRIEF DESCRIPTION OF THE DRAWINGS

The novel features which are considered characteristic of the present invention are set forth with particularity in the appended claims. The present invention itself, however, and additional objects and advantages thereof will best be understood from the following description of embodiments thereof when read in connection with the accompanying drawings, in which:

FIG. 5 is a representation illustrating heating points on a substrate by radiation by means of a conventional heating means as shown in FIG. 4.

DETAILED DESCRIPTION OF THE INVENTION

Figure 1:
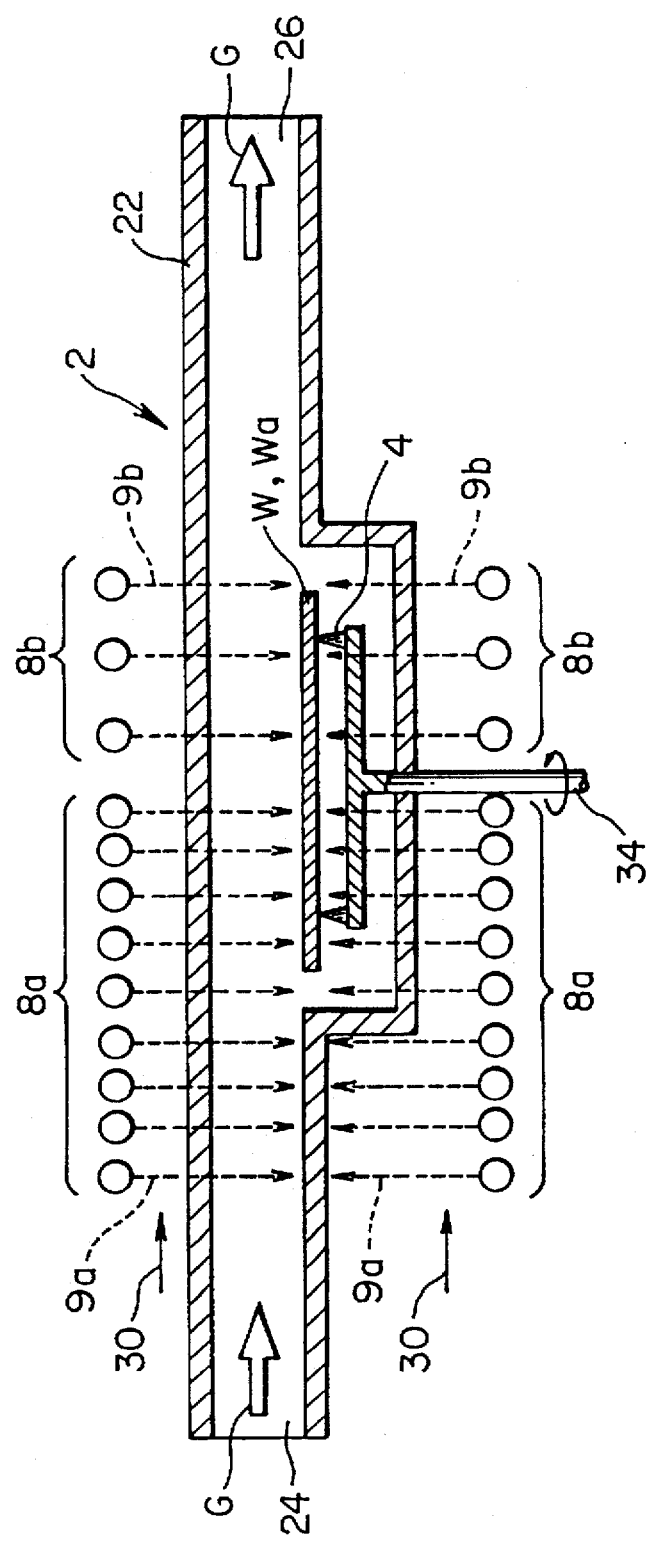
FIG. 1 is a schematic, sectional view showing an example of a growth apparatus used in a first embodiment of the method of producing a single crystal film according to the present invention.

Below, description will be given about embodiments according to the present invention and a comparative example in reference to accompanying drawings. FIG. 1 is a schematic, sectional view showing an example of the horizontal vapor phase growth apparatus used in a first embodiment of the method of the present invention. In FIG. 1, the reference numerals indicating the same or similar parts are the same as those in FIG. 4.

As shown in FIG. 1, a horizontal vapor phase growth apparatus 2 used in the first embodiment of the method of the present invention comprises a transparent quartz glass reaction vessel 22 which is held horizontally and which is equipped with an inlet port 24 and exhaust port 26 for a reaction gas G, wherein a semiconductor single crystal substrate W is placed in the reaction vessel 22. The reaction vessel 22 is of a cold wall type which has a cooling means 30 for cooling the outer wall of the reaction vessel 22. In such a reaction vessel 22, deposition which is resulted from a reaction or decomposition of raw material gases for vapor phase growth, on the inner wall of a reaction vessel is prevented.

The semiconductor single crystal substrate W is supported on a transparent quartz glass holder 4 with pointed ends of three small projections provided on the holder 4 so that the ends contact to the backside surface of the substrate W, and the front main surface and backside surface are directly heated from the exterior of the reaction vessel 22 with radiation heating lamps 8a, 8b. The spatial configuration of the heating lamps 8a, 8b were such that the distances between the lamps 8a, 8b and the substrate W are both the same 150 mm and the lamps 8a, 8b are spatially arranged so as to cover all the front main surface and backside surface.

As seen from a view in FIG. 1, for example, a control circuit for the radiation heating lamps 8a which radiates infrared light 9a on the upstream side of the substrate W, which means upstream relative to the center thereof, is independent of another control circuit for the radiation heating lamps 8b which radiates infrared light 9b on the downstream of the substrate W in order to make it possible to heat more intensively the upstream side in regard to the flow of the reaction gas G than the downstream side.

The radiation heating lamps 8a heating the upstream side are more in number than the radiation heating lamps 8b heating the downstream side in order to give minimum load to any of the radiation heating lamps 8a.

A temperature profile across the substrate Wa is measured with a thermocouple embedded specially in the bulk of the substrate Wa and heating energy output distribution across the heating lamps arrangement is adjusted in reference to the measurements such that uniform temperature profile may be attained, before an actual vapor growth using the horizontal vapor phase growth apparatus 2.

A thermocouple was embedded in the bulk of a silicon single crystal substrate Wa of 200 mm in diameter. The substrate Wa was then inserted into a reaction vessel 22 and placed on a transparent quartz glass holder 4 with pointed upper ends of three small projections provided on the holder 4 so that the ends contact to the backside surface of the substrate Wa. After placing the substrate Wa on the holder 4, hydrogen gas was fed into the reaction vessel 22 through an inlet port 24 for a reaction gas G at a linear speed of 0.3 m/sec at the inlet port 24.

While the hydrogen gas flew almost horizontally in one direction in the reaction vessel 22, the silicon single crystal substrate Wa in which the thermocouple was embedded was heated on both the front main surface and backside surface at the same time through the transparent quartz glass wall of the reaction vessel 22 by means of radiation heating lamps 8a, 8b.

When a temperature of the central portion of the substrate Wa in which the thermocouple was embedded was stabilized at 1150° C. after heating up, an energy output from each of the radiation heating lamps 8a arranged in the upstream of the hydrogen gas flow was adjusted to a larger value by a maximum of 30% than that of the radiation heating lamps 8b arranged in the downstream. With such a increment in energy output of the radiation lamps 8a, the upstream side of the substrate Wa was heated more intensively by an increment in receiving energy equivalent to 5° C. to 10° C. in temperature change of the substrate Wa than the downstream side to thereby attain a energy output distribution of the radiation heating lamps 8a, 8b suitable for a uniform temperature profile across the substrate Wa.

In a next run, a p-type silicon single crystal substrate W highly doped with boron which has a diameter of 200 mm and a surface orientation of (100) was inserted into the reaction vessel 22 and held on the transparent quartz glass holder 4 to support the substrate W with pointed upper ends of three small projections provided on the holder so that the ends contact to the backside surface of the substrate W. While flowing hydrogen gas at a feed rate of 100 l/min through the reaction vessel 22 nearly horizontally in one direction, the substrate W was heated up on both the front main surface and backside surface at the same time by means of the radiation heating lamps 8a, 8b.

Heating by the radiation heating lamps 8a, 8b had been adjusted in terms of heating energy output in such a manner that the radiation beams 9a impinging on the upstream side relative to the center of the substrate W were larger in energy output than those 9b on the downstream side by an energy output difference equivalent to 5° C. to 10° C. in temperature change of the substrate W and thereby the temperature profile across the substrate W became uniform.

When a temperature of the central portion of the silicon single crystal substrate W was stabilized at 1150° C. after heating up, a reaction gas G was supplied to the substrate W, where the gas was a mixture of hydrogen gas of 100 liters per minute and a raw material gas of trichlorosilane at a content thereof of 3.5 mol % and doped with a trace amount of diborane. A silicon single crystal thin film with a thickness of 5 μm was thus grown on the silicon single crystal substrate W. No slippage was found throughout the surface of the thin film on the substrate W.

Needless to say, in the above example, hydrogen gas was used as a main ingredient of the reaction gas, since vapor phase growth of a silicon single crystal thin film was taken up for an explanation of the present invention, but other gases such as nitrogen, argon gas, helium gas and the like are useful as an alternative in cases of vapor phase growth of thin films of other materials than silicon.

Besides, in the above example, the holder 4 held the silicon single crystal substrate W on three small projections provided thereon with a pointed upper edge for each by contacting the backside surface of the substrate W, all that are required for a holder 4 is that no capability of heating and three or more pointed upper edges or a ring-like body lying between the substrate W and the holder for supporting.

Figure 2:
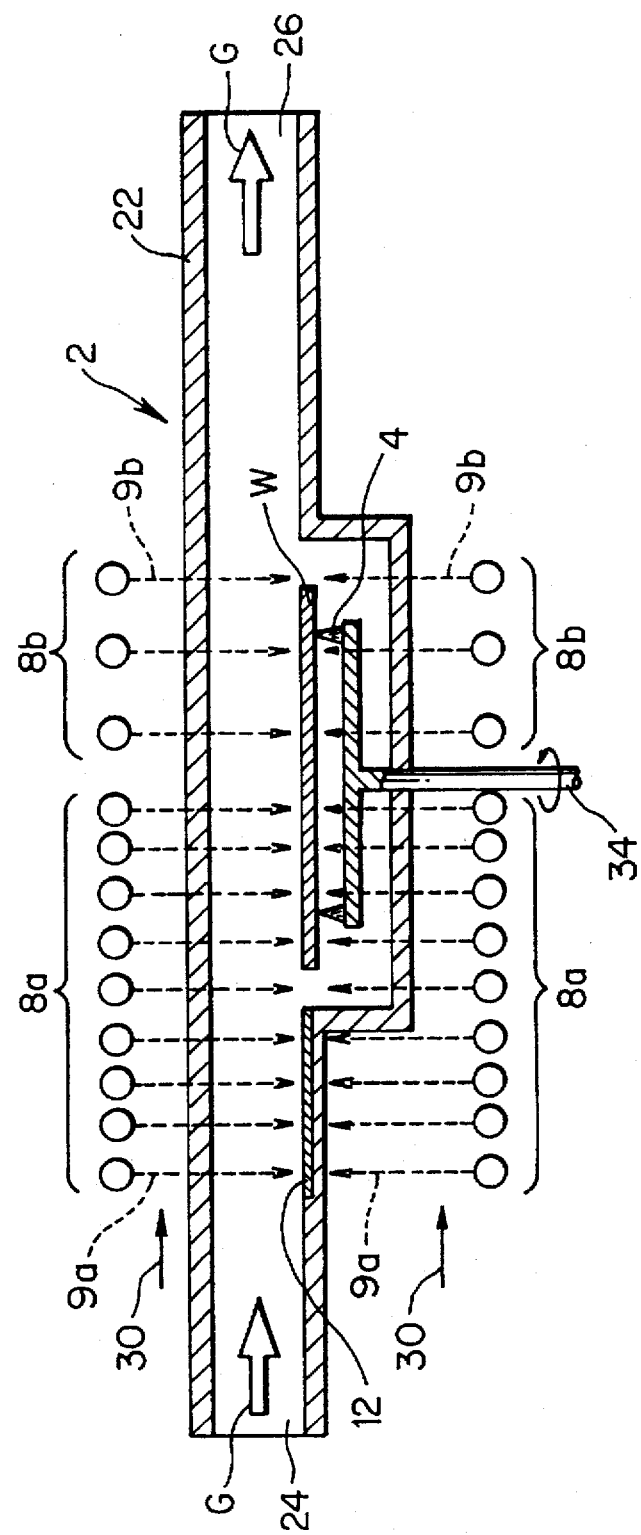
FIG. 2 is a schematic, sectional view showing an example of a growth apparatus used in a second embodiment of the method of producing a single crystal film according to the present invention.
Figure 3:
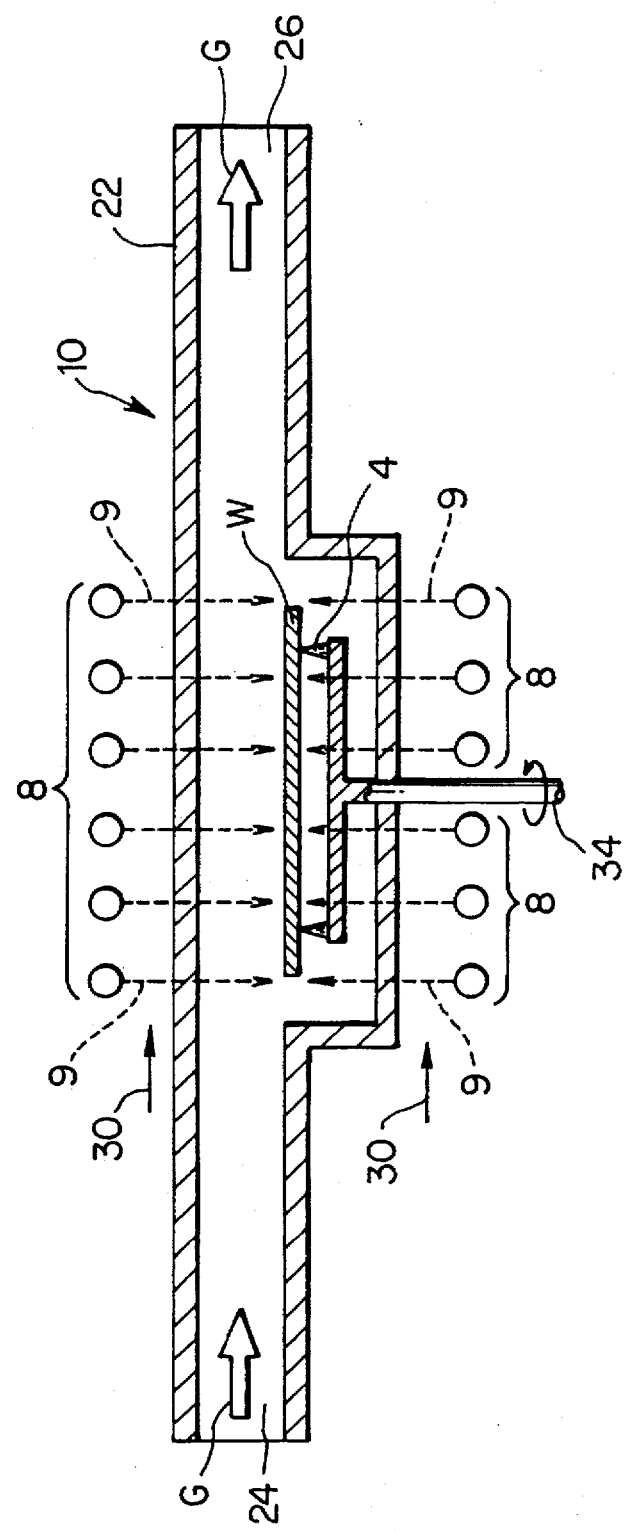
FIG. 3 is a schematic, sectional view illustrating a horizontal vapor phase growth apparatus used in experiments carried out in the course leading to the present invention.

Now, a second embodiment of the method of the present invention will be described in reference to FIG. 2. FIG. 2 is a sectional view illustrating another horizontal vapor phase growth apparatus used in the second embodiment. In FIG. 2, the numeral references indicating the same or similar parts are the same as those in FIG. 4.

The apparatus shown in FIG. 2 which was urged in the second embodiment of the method of the present invention has basically the same structure as the structure of the apparatus shown in FIG. 1. However, as shown in FIG. 2, an auxiliary heating region 12 for heating a reaction gas G is equipped in an upstream part relative to a place where a semiconductor single crystal substrate W stays. With the auxiliary heating region 12, a cold reaction gas is heated enough not to lower a temperature of the surface of the substrate W prior to contacting the front main surface of the substrate W, wherein the substrate W is supported by a holder 4 having no capability of heating.

For the auxiliary heating region 12, as a heater, a high-purity carbon body coated by any material of silicon, silicon carbide, quartz and ceramics is used. The auxiliary heating region 12 is primarily heated up either by part of the radiation lamp arrangement 8a extending over the carbon body, by induction heating which is effected with an induction coil lying directly under the carbon body or by resistance heating wherein the carbon body functions as a resistance.

With the auxiliary heating region 12, a relative increment of heating energy radiated on the upstream side of the substrate W can be smaller over that on the downstream side according to an extent of the auxiliary heating. When a flow rate of the reaction gas G is small enough for the auxiliary heating region 12 to make a uniform temperature profile across the substrate W by itself, the heating energy output required over the substrate W is same on both the upstream side and downstream side.

Figure 4:
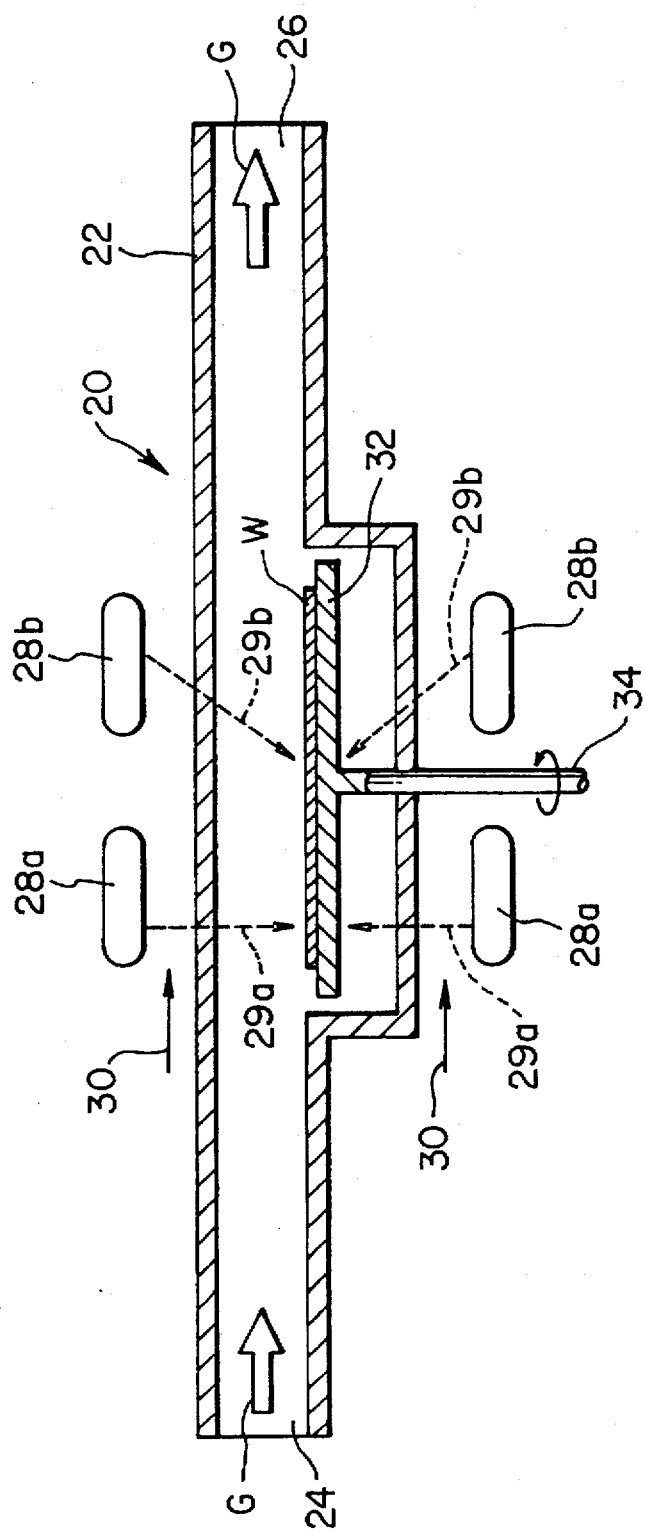
FIG. 4 is a schematic, sectional view illustrating a horizontal vapor phase growth apparatus used in embodying a conventional method of producing a single crystal thin film

A case is described below that a conventional vapor growth apparatus 20 as shown in FIG. 4 was used with a transparent quartz glass holder equipped therein as a replacement of the susceptor 32, wherein the holder 4 supported a semiconductor single crystal substrate W on pointed upper edges of small projections provided thereon so that the edges contact to the backside of the substrate W.

A conventional vapor phase growth apparatus 20 comprises, as shown in FIG. 5, radiation heating lamps 28a, 28b arranged in axial symmetry about the perpendicular line passing the center of the substrate W. The lamps 28a, 28b are grouped in two or three, and one group designated with 28a of which emit radiation beams 29a mainly directed to the outer portion 23a of the substrate W and the other group designated 28b emit radiation beans 29b directed to the central portion 23b of the substrate W.

In the conventional vapor phase growth apparatus 20, the substrate W was placed on a high-purity carbon susceptor 32 coated with silicon carbide and the susceptor 32 was turned about the center of the susceptor 32 as a central axis to realize a uniform temperature profile across the substrate W.

For an experiment, in a reaction vessel 22 of the conventional apparatus 20, however, when a transparent quartz glass holder 4 was used to hold the semiconductor single crystal substrate W with pointed upper ends of small three projections provided thereon so that the ends contact to the backside of the substrate W, and vapor phase growth was carried out under the same conditions as those in the first example, while heating the substrate W effected in a condition that the same energy output was applied to both in the upstream side an downstream side at the substrate W, Much slippage was observed in the peripheral portion of the substrate W. To conclude, it was confirmed that a conventional apparatus 20 is not proper in execution of the present invention in which temperatures on a substrate were controlled imaginarily dividing the whole surface of the substrate W into two regions of the central portion and outer portion.

We claim:

1. A method of producing a single crystal thin film in a reaction vessel of a cold wall type with a holder which has no capability of heating, said method comprising the steps of: placing a semiconductor single crystal substrate(s) on the holder; feeding a reaction gas to flow in one direction in the vessel; adjusting a temperature profile of the substrate(s) to be uniform along the flow direction of the reaction gas and growing the single crystal film on the substrate(s).

2. A method of producing a single crystal thin film according to claim 1, wherein the temperature profile of the semiconductor single crystal substrate is made uniform by heating more intensively at the upstream side than at the downstream side relative to the center of the substrate(s).

3. A method of producing a single crystal thin film according to claim 2, wherein the heating is spatially adjusted in such a manner that it is more intensive on the upstream side in terms of receiving energy than on the downstream side by a difference equivalent to 5° C. to 10° C. in temperature change of the substrate(s).

4. A method of producing a single crystal thin film according to claim 1, wherein an auxiliary heating region for heating the reaction gas is provided in an upstream part relative to the substrate(s) in order to make the temperature profile of the substrate uniform.

5. A method of producing a single crystal thin film according to claim 2, wherein an auxiliary heating region for heating the reaction gas is provided in an upstream part relative to the substrate(s) in order to make the temperature profile of the substrate uniform.

6. A method of producing a single crystal thin film according to claim 3, wherein an auxiliary heating region for heating the reaction gas is provided in an upstream part relative to the substrate(s) in order to make the temperature profile of the substrate uniform.

7. A method of producing a single crystal thin flat according to claim 4, wherein the auxiliary heating region is made of carbon.

8. A method of producing a single crystal thin film according to claim 5, wherein the auxiliary heating region is made of carbon.

9. A method of producing a single crystal thin film according to claim 6, wherein the auxiliary heating region is made of carbon.

10. A method of producing a single crystal thin film according to claim 4, wherein the auxiliary heating region is a heater coated with any material of silicon, silicon carbide, quartz or ceramics.

11. A method of producing a single crystal thin film according to claim 5, wherein the auxiliary heating region is a heater coated with any material of silicon, silicon carbide, quartz or ceramics.

12. A method of producing a single crystal thin film according to claim 6, wherein the auxiliary heating region is a heater coated with any material of silicon, silicon carbide, quartz or ceramics.

13. A method of producing a single crystal thin film according to claim 1, wherein the holder with no capability of heating is made of quartz or silicon carbide, and the substrate(s) is supported on the holder with pointed upper ends of three of more small projections provided thereon so that the ends contact to the backside surface of the substrate or with a ring-like body lying between the substrate(s) and the holder.

14. A method of producing a single crystal thin film according to claim 2, wherein the holder with no capability of heating is made of quartz or silicon carbide, and the substrate(s) is supported on the holder with pointed upper ends of three of more small projections provided thereon so that the ends contact to the backside surface of the substrate or with a ring-like body lying between the substrate(s) and the holder.

15. A method of producing a single crystal thin film according to claim 3, wherein the holder with no capability of heating is made of quartz or silicon carbide, and the substrate(s) is supported on the holder with pointed upper ends of three of more small projections provided thereon so that the ends contact to the backside surface of the substrate or with a ring-like body lying between the substrate(s) and the holder.

16. A method of producing a single crystal thin film according to claim 4, wherein the holder with no capability of heating is made of quartz or silicon carbide, and the substrate(s) is supported on the holder with pointed upper ends of three of more small projections provided thereon so that the ends contact to the backside surface of the substrate or with a ring-like body lying between the substrate(s) and the holder.

17. A method of producing a single crystal thin film according to claim 5, wherein the holder with no capability of heating is made of quartz or silicon carbide, and the substrate(s) is supported on the holder with pointed upper ends of three of more small projections provided thereon so that the ends contact to the backside surface of the substrate or with a ring-like body lying between the substrate(s) and the holder.

18. A method of producing a single crystal thin film according to claim 6, wherein the holder with no capability of heating is made of quartz or silicon carbide, and the substrate(s) is supported on the holder with pointed upper ends of three of more small projections provided thereon so that the ends contact to the backside surface of the substrate or with a ring-like body lying between the substrate(s) and the holder.

19. A method of producing a single crystal thin film according to claim 7, wherein the holder with no capability of heating is made of quartz or silicon carbide, and the substrate(s) is supported on the holder with pointed upper ends of three of more small projections provided thereon so that the ends contact to the backside surface of the substrate or with a ring-like body lying between the substrate(s) and the holder.

20. A method of producing a single crystal thin film according to claim 10, wherein the holder with no capability of heating is made of quartz or silicon carbide, and the substrate(s) is supported on the holder with pointed upper ends of three of more small projections provided thereon so that the ends contact to the backside surface of the substrate or with a ring-like body lying between the substrate(s) and the holder.

* * * * *